(12) United States Patent
Baptist et al.

(10) Patent No.: US 10,180,787 B2
(45) Date of Patent: Jan. 15, 2019

(54) DISPERSED STORAGE WRITE PROCESS WITH LOCK/PERSIST

(71) Applicant: International Business Machines Corporation, Armonk, NY (US)

(72) Inventors: Andrew D. Baptist, Mt. Pleasant, WI (US); Ravi V. Khadiwala, Bartlett, IL (US); Mingyu Li, Chicago, IL (US); Manish Motwani, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/428,293

(22) Filed: Feb. 9, 2017

(65) Prior Publication Data

US 2018/0225044 A1   Aug. 9, 2018

(51) Int. Cl.
*G06F 11/00* (2006.01)
*G06F 3/06* (2006.01)
*G06F 11/10* (2006.01)
*H03M 13/15* (2006.01)
*H03M 13/00* (2006.01)

(52) U.S. Cl.
CPC ............ *G06F 3/0604* (2013.01); *G06F 3/064* (2013.01); *G06F 3/067* (2013.01); *G06F 3/0619* (2013.01); *G06F 3/0637* (2013.01); *G06F 3/0644* (2013.01); *G06F 11/1076* (2013.01); *H03M 13/1515* (2013.01); *H03M 13/6566* (2013.01)

(58) Field of Classification Search
CPC .... G06F 1/0604; G06F 3/0619; G06F 3/0637; G06F 3/0644; H03M 13/6566
See application file for complete search history.

(56) References Cited

U.S. PATENT DOCUMENTS

| | | | |
|---|---|---|---|
| 4,092,732 A | 5/1978 | Ouchi | |
| 5,263,085 A * | 11/1993 | Shamir | ................ H04L 9/302 380/28 |
| 5,454,101 A | 9/1995 | Mackay et al. | |
| 5,485,474 A | 1/1996 | Rabin | |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Esaw T Abraham
(74) *Attorney, Agent, or Firm* — Garlick & Markison; Timothy W. Markison; Kelly H. Hale

(57) ABSTRACT

A method begins by one or more processing modules of one or more computing devices of a dispersed storage network (DSN) determining that dispersed error encoded data slices stored in a plurality of distributed storage units of the DSN are to be updated and then sending a plurality of lock requests respectively to the plurality of distributed storage units. The method continues with the processing modules receiving a response from a write threshold number of distributed storage units of the plurality of distributed storage units that a lock request has been granted by each of the write threshold number of distributed storage units and then sending a persist message to each of the write threshold number of distributed storage units from which the lock request has been granted.

19 Claims, 19 Drawing Sheets

(56) References Cited

U.S. PATENT DOCUMENTS

| | | | |
|---|---|---|---|
| 5,774,643 A * | 6/1998 | Lubbers | G06F 11/1076 711/114 |
| 5,802,364 A | 9/1998 | Senator et al. | |
| 5,809,285 A * | 9/1998 | Hilland | G06F 3/0608 703/25 |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A * | 1/2000 | Fischer | H03M 13/13 714/755 |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 * | 12/2009 | de la Torre | H03M 7/30 |
| 7,966,470 B2 * | 6/2011 | Sakurai | G06F 3/0607 711/114 |
| 2002/0062422 A1 | 5/2002 | Butterworth et al. | |
| 2002/0166079 A1 | 11/2002 | Ulrich et al. | |
| 2003/0005386 A1 * | 1/2003 | Bhatt | H04L 1/0009 714/774 |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0203910 A1 * | 8/2007 | Ferguson | G06F 17/30575 |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2008/0183975 A1 * | 7/2008 | Foster | G06F 11/1076 711/153 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2010/0274983 A1 * | 10/2010 | Murphy | G06F 11/1456 711/162 |
| 2012/0290877 A1 * | 11/2012 | Grube | G06F 11/0727 714/15 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

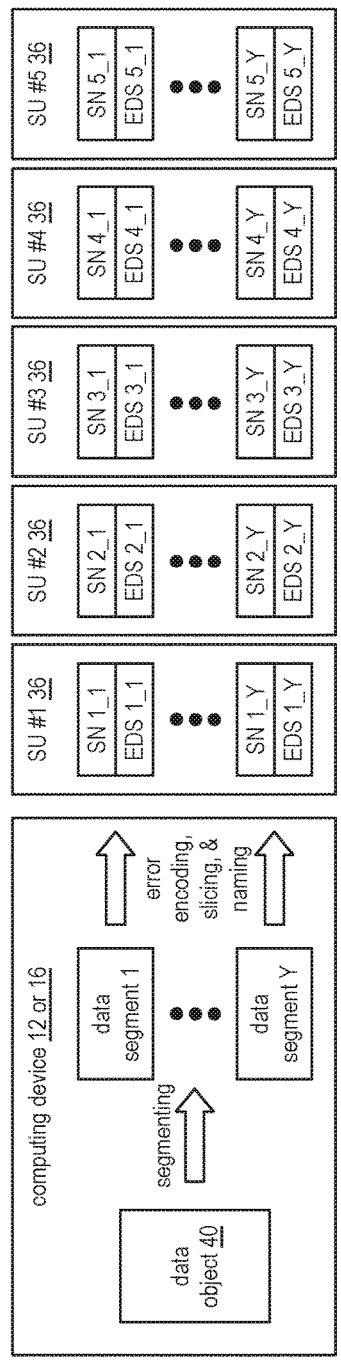
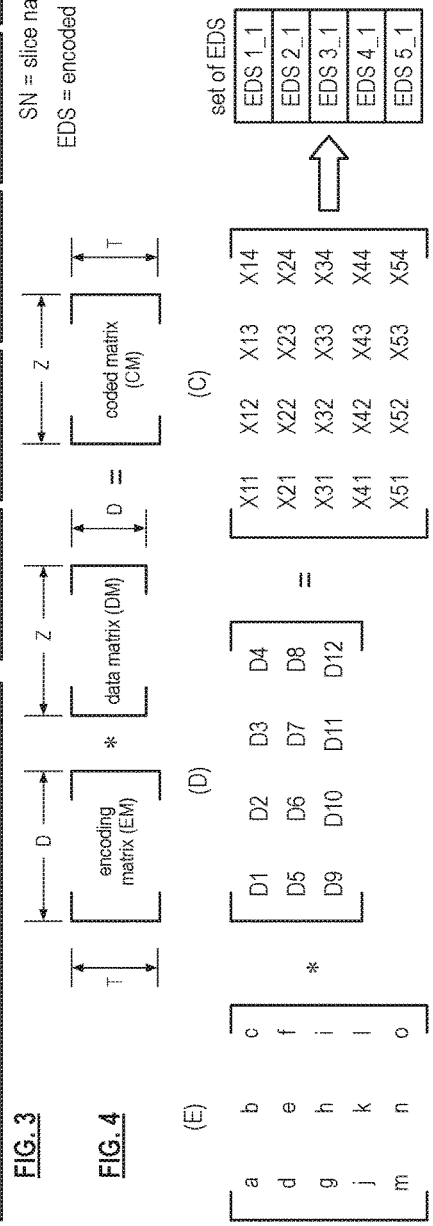
FIG. 3
FIG. 4
FIG. 5
FIG. 6

FIG. 10B

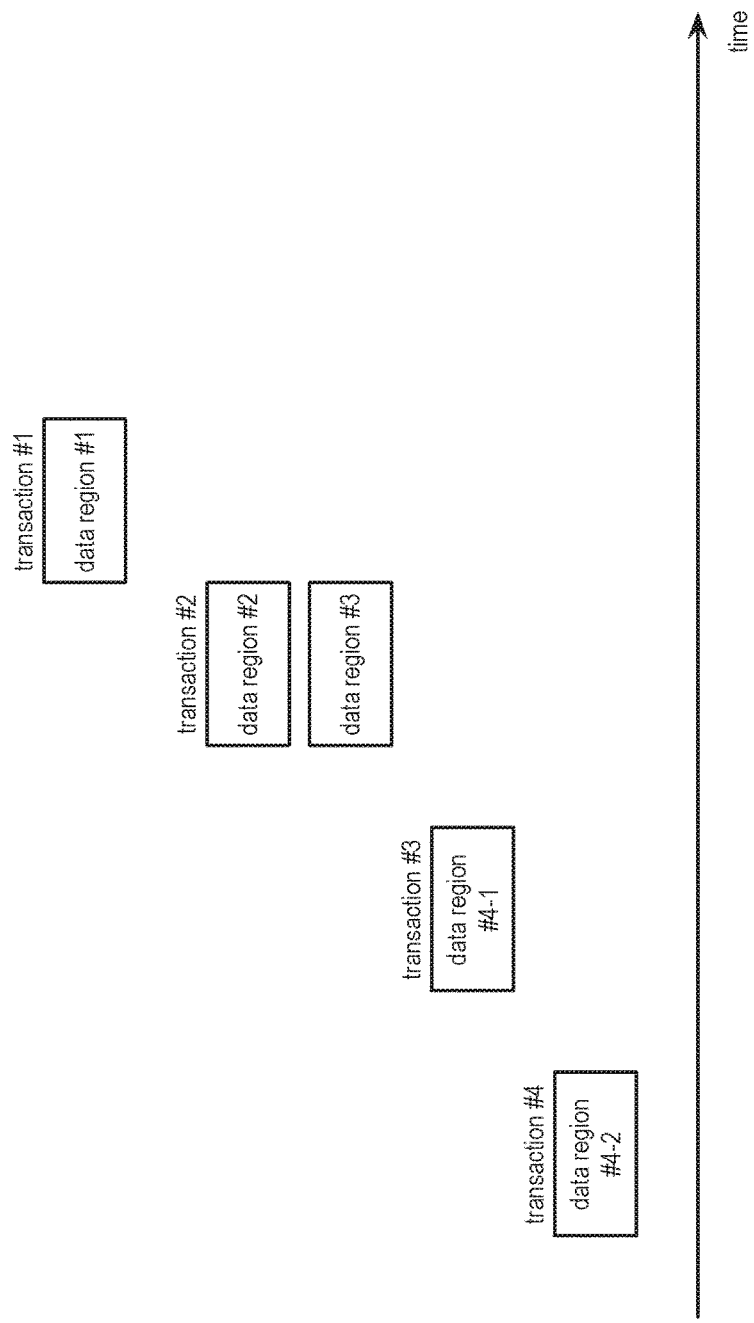

DISPERSED STORAGE WRITE PROCESS WITH LOCK/PERSIST

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

Figure 11:
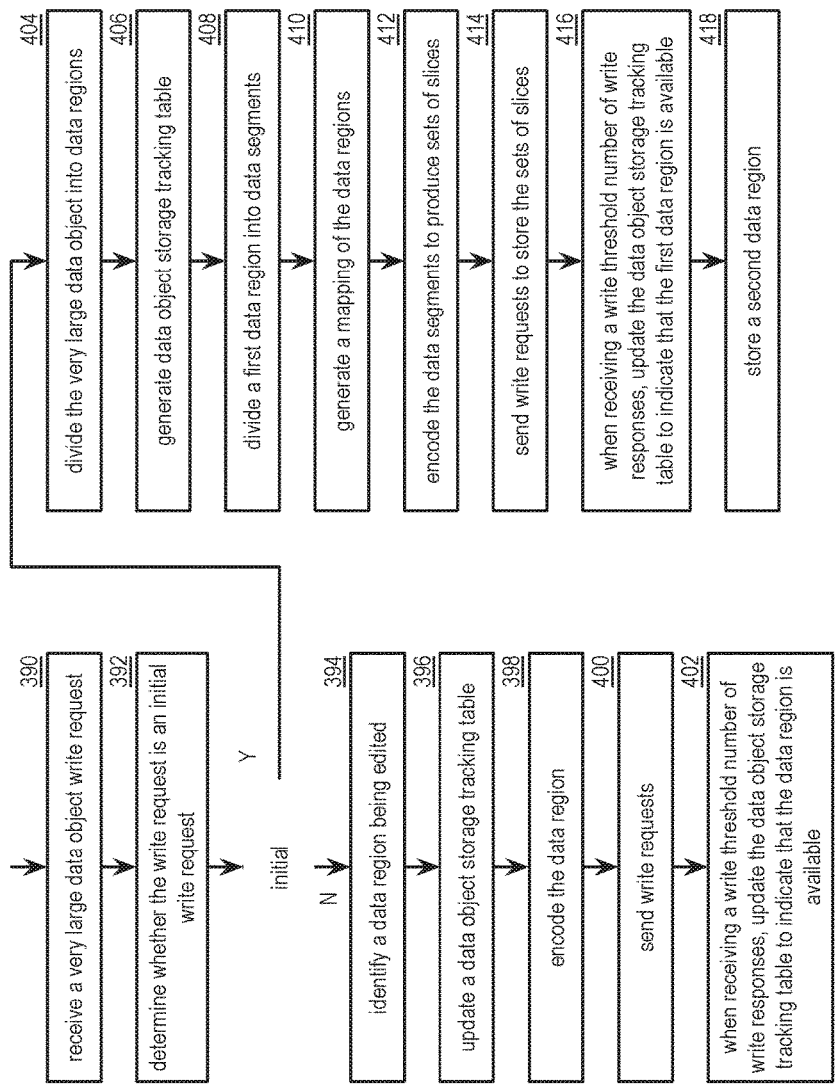
Figure 12:
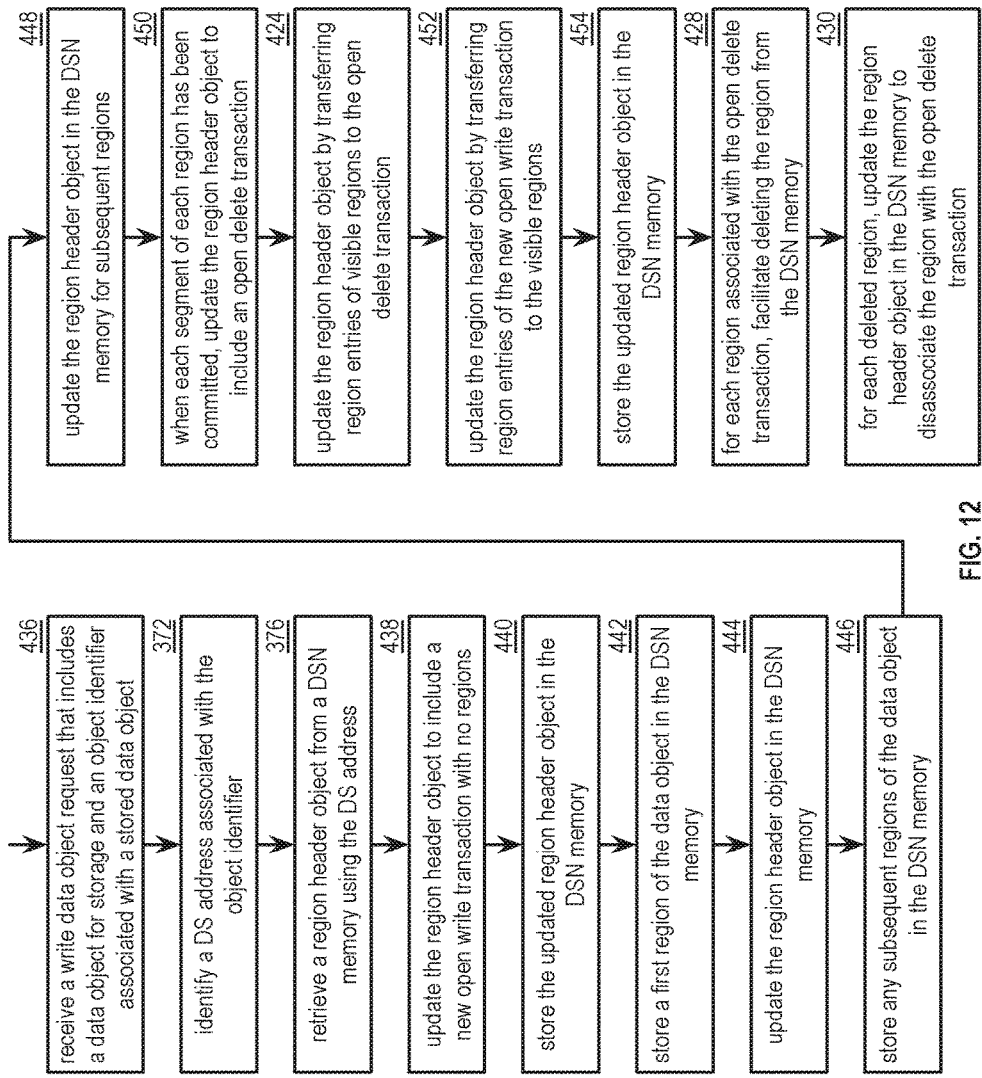
Figure 13:
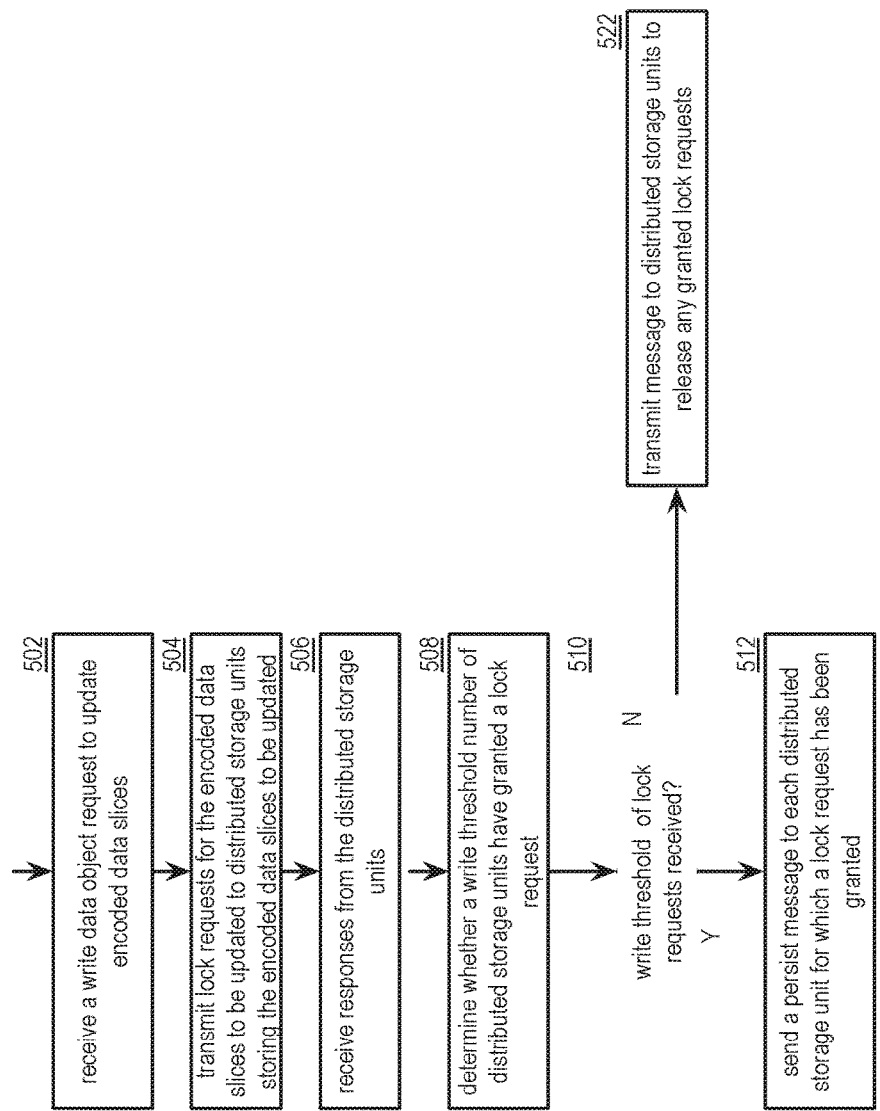
Figure 14:
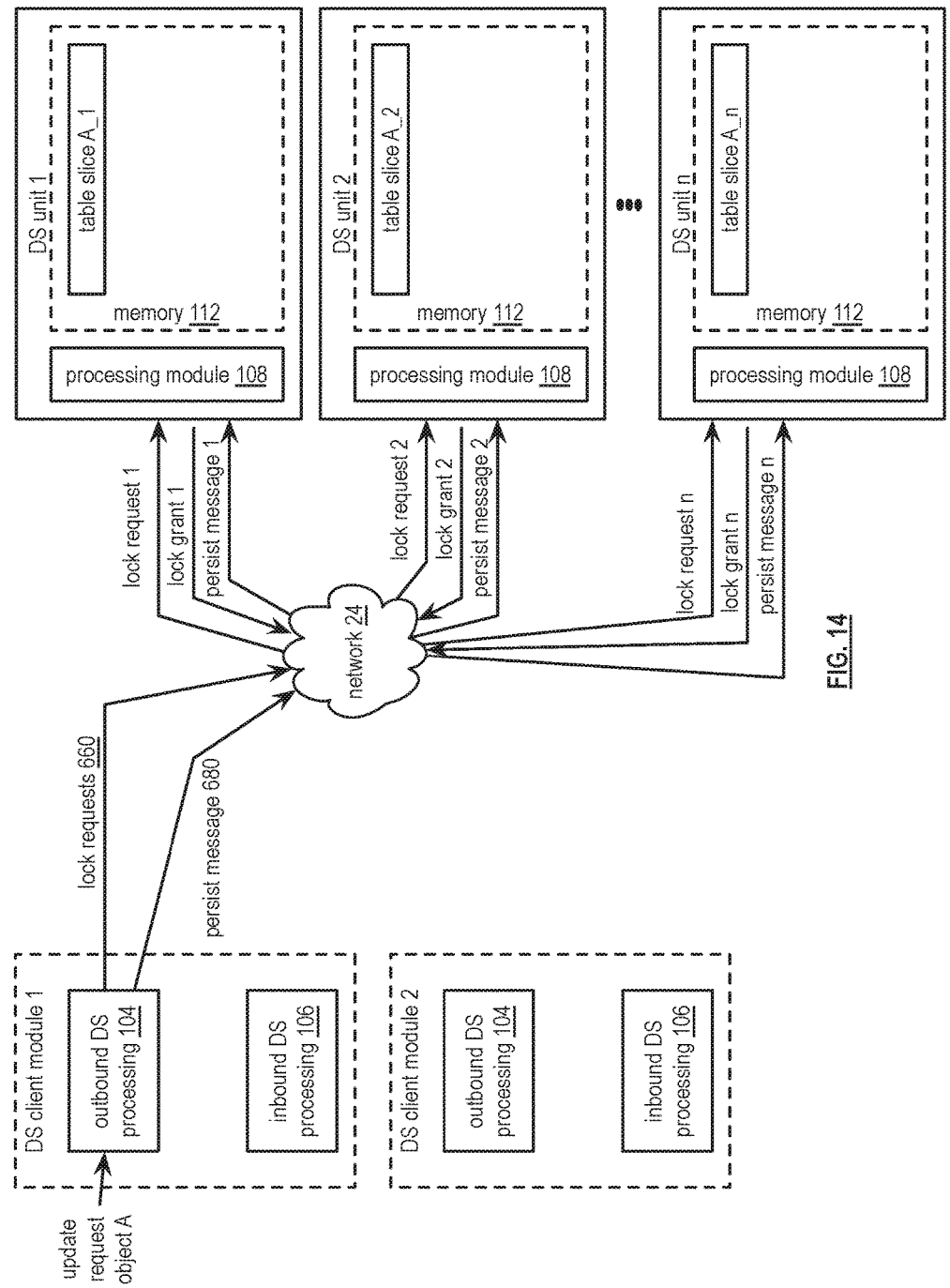

FIG. 10F-J are diagrams of an embodiment of a dispersed storage network (DSN) illustrating steps of an example of writing data in accordance with the present invention;

FIG. 11 is a flowchart illustrating an example of writing a data object in accordance with the present invention;

FIG. 12 is a flowchart illustrating an example of overwriting a data object in accordance with the present invention;

FIG. 13 is a flowchart illustrating an example of updating a data object in accordance with the present invention;

FIG. 14 is a schematic block diagram of an example of updating data in accordance with the present invention.

DETAILED DESCRIPTION OF THE INVENTION

Figure 1:
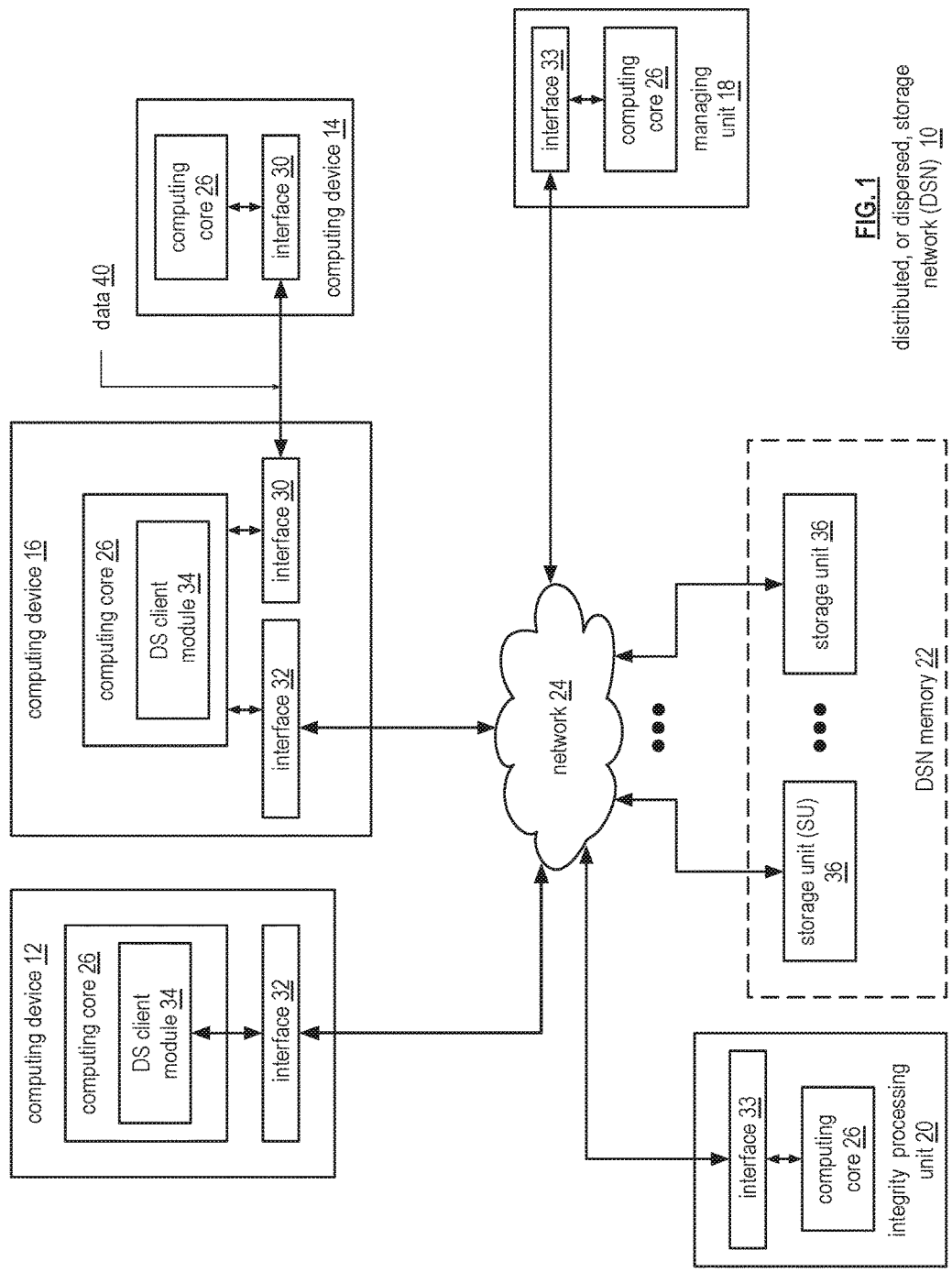
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units

Figure 2:
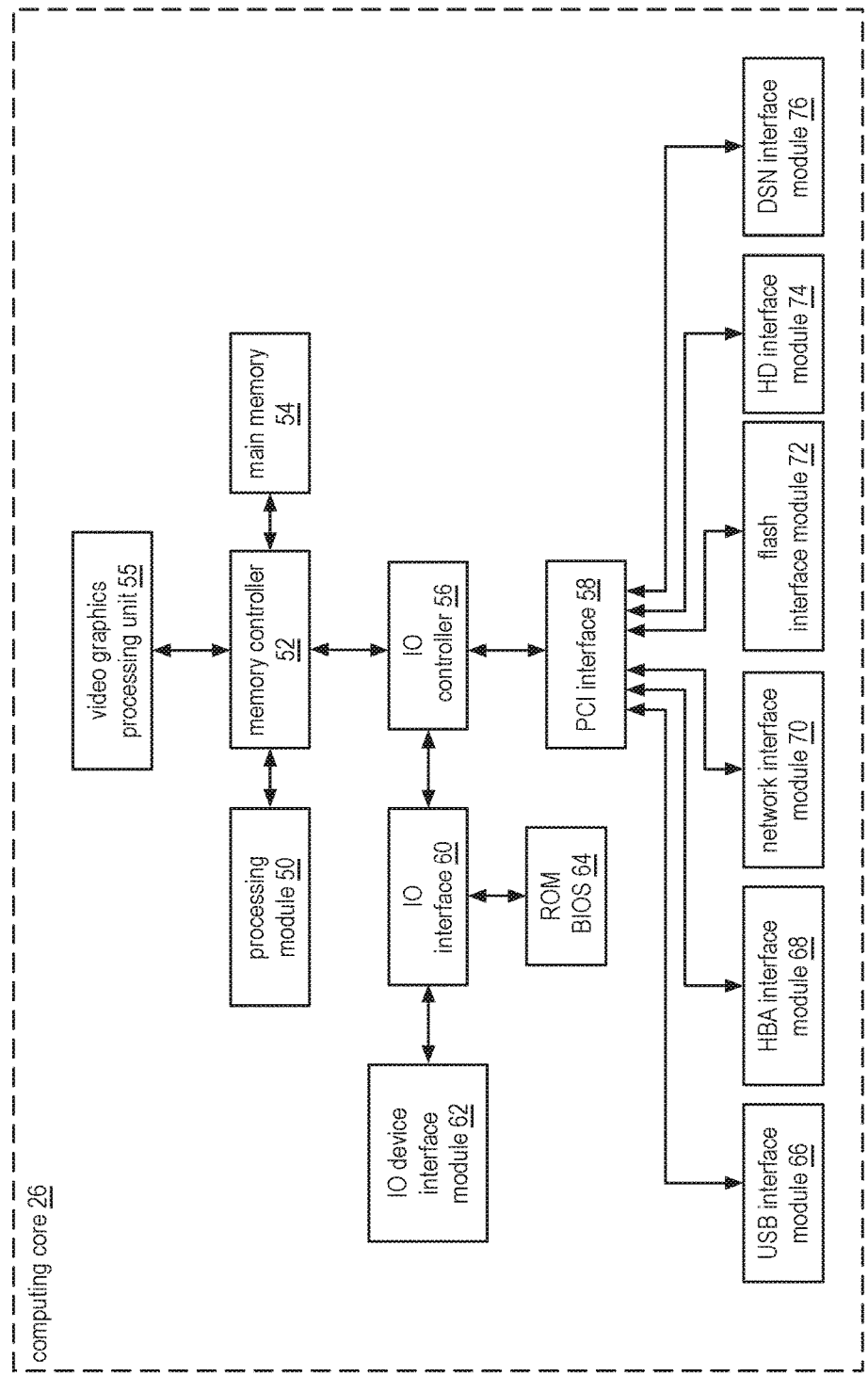
FIG. 2 is a schematic block diagram of an embodiment of a computing core in accordance with the present invention.

36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), interne small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
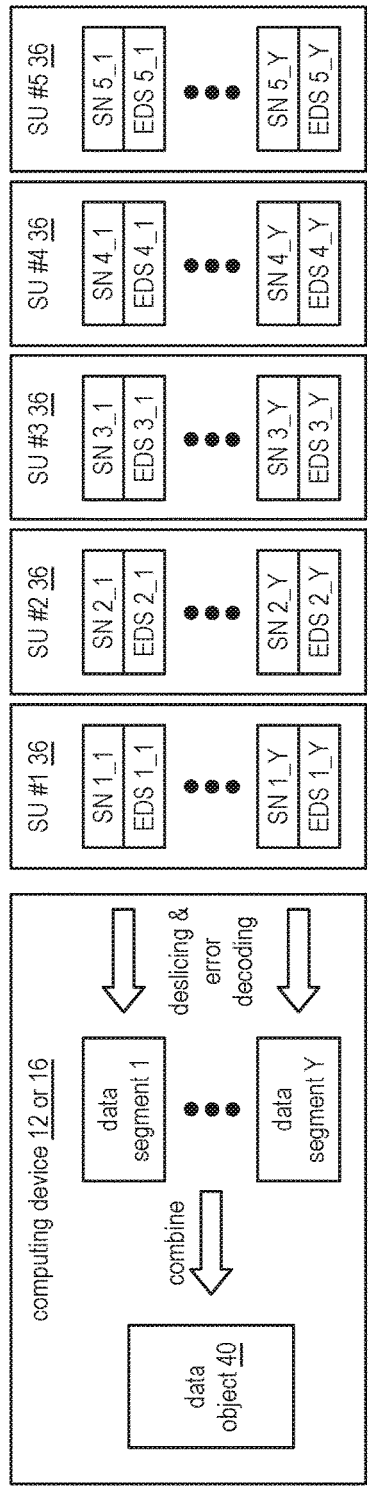
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
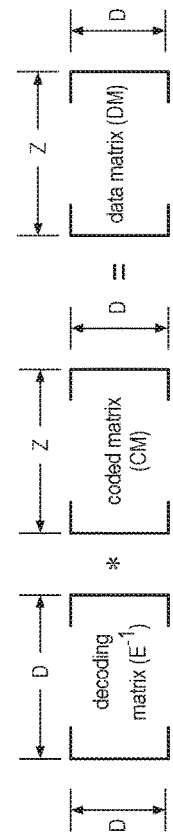
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
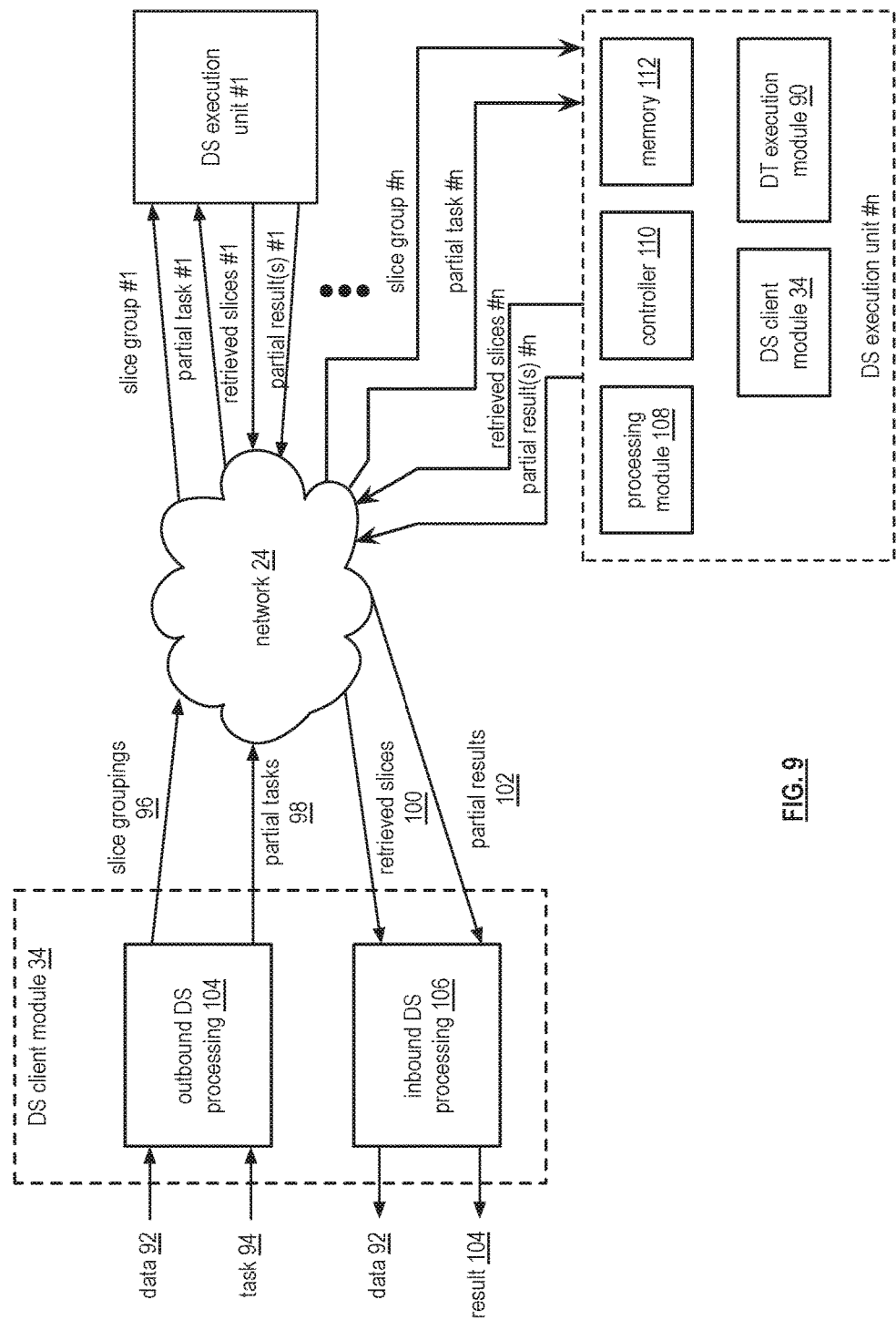
FIG. 9 is a diagram of an example of a distributed storage and task processing in accordance with the present invention.

FIG. 9 is a diagram of an example of the distributed computing system performing a distributed storage and task processing operation. The distributed computing system includes a DS (distributed storage and/or task) client module 34 (which may be in user device 14 and/or in DS processing unit 16 of FIG. 1), a network 24, a plurality of DS execution units 1-*n* that includes two or more DS execution units 36 of FIG. 1 (which form at least a portion of DSTN module 22 of FIG. 1), a DS managing module (not shown), and a DS integrity verification module (not shown). The DS client module 34 includes an outbound DS processing section 104 and an inbound DS processing section 106. Each of the DS execution units 1-$n$ includes a controller 110, a processing module 108, memory 112, a DT (distributed task) execution module 90, and a DS client module 34.

In an example of operation, the DS client module 34 receives data 92 and one or more tasks 94 to be performed upon the data 92. The data 92 may be of any size and of any content, where, due to the size (e.g., greater than a few Terra-Bytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

Within the DS client module 34, the outbound DS processing section 104 receives the data 92 and the task(s) 94. The outbound DS processing section 104 processes the data 92 to produce slice groupings 96. As an example of such processing, the outbound DS processing section 104 partitions the data 92 into a plurality of data partitions. For each data partition, the outbound DS processing section 104 dispersed storage (DS) error encodes the data partition to produce encoded data slices and groups the encoded data slices into a slice grouping 96. In addition, the outbound DS processing section 104 partitions the task 94 into partial tasks 98, where the number of partial tasks 98 may correspond to the number of slice groupings 96.

The outbound DS processing section 104 then sends, via the network 24, the slice groupings 96 and the partial tasks 98 to the DS execution units 1-$n$ of the DSTN module 22 of FIG. 1. For example, the outbound DS processing section 104 sends slice group 1 and partial task 1 to DS execution unit 1. As another example, the outbound DS processing section 104 sends slice group #n and partial task #n to DS execution unit #n.

Each DS execution unit performs its partial task 98 upon its slice group 96 to produce partial results 102. For example, DS execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DS execution units send, via the network 24, their partial results 102 to the inbound DS processing section 106 of the DS client module 34. The inbound DS processing section 106 processes the received partial results 102 to produce a result 104. Continuing with the specific example of the preceding paragraph, the inbound DS processing section 106 combines the phrase count from each of the DS execution units 36 to produce a total phrase count. In addition, the inbound DS processing section 106 combines the 'where the phrase was found' information from each of the DS execution units 36 within their respective data partitions to produce 'where the phrase was found' information for the series of digital books.

In another example of operation, the DS client module 34 requests retrieval of stored data within the memory of the DS execution units 36 (e.g., memory of the DSTN module). In this example, the task 94 is retrieve data stored in the memory of the DSTN module. Accordingly, the outbound DS processing section 104 converts the task 94 into a plurality of partial tasks 98 and sends the partial tasks 98 to the respective DS execution units 1-$n$.

In response to the partial task 98 of retrieving stored data, a DS execution unit 36 identifies the corresponding encoded data slices 100 and retrieves them. For example, DS execution unit #1 receives partial task #1 and retrieves, in response thereto, retrieved slices #1. The DS execution units 36 send their respective retrieved slices 100 to the inbound DS processing section 106 via the network 24.

The inbound DS processing section 104 converts the retrieved slices 100 into data 92. For example, the inbound DS processing section 106 de-groups the retrieved slices 100 to produce encoded slices per data partition. The inbound DS processing section 104 then DS error decodes the encoded slices per data partition to produce data partitions. The inbound DS processing section 104 de-partitions the data partitions to recapture the data 92.

Figure 10A:
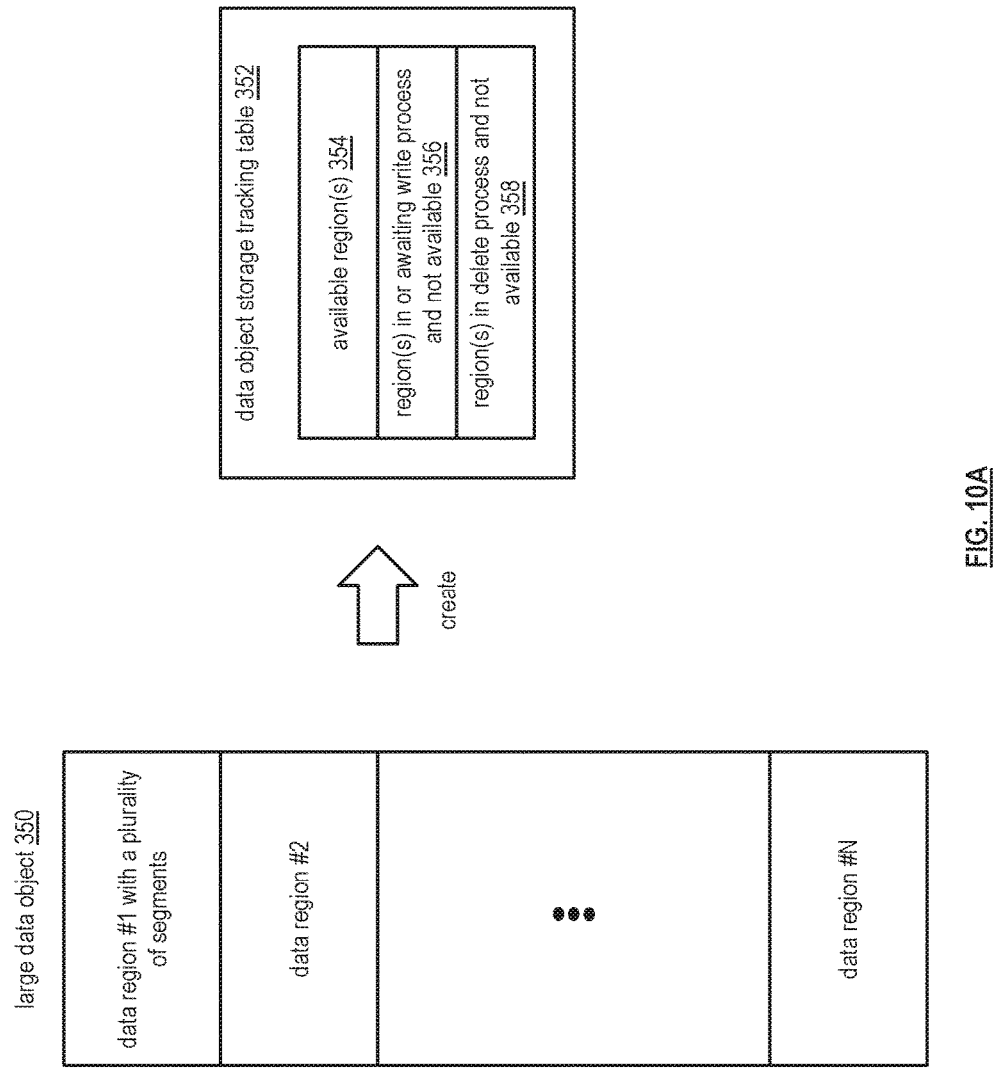
FIG. 10A is a diagram of an embodiment of a structure of a large data object in accordance with the present invention.

FIG. 10A is a diagram of an embodiment of a structure of a large data object 350 where the large data object 350 is divided into data regions 1-N. The large data object 350 includes at least one of a multimedia file, a video file, an audio file, a text file, an image file, a drawing file, etc. The large data object 350 may include as many as 100 MB or more. A data object storage tracking table 352 is created with regards to storage of the large data object 350 and a dispersed storage network. The data object storage tracking table 352 includes an available region(s) field 354, a region(s) in or awaiting write process and not available field 356, and a region(s) in delete process and not available field 358.

The fields of the data object storage tracking table 352 are utilized to track status of storage of the data regions of the large data object 350. For example, the available region(s) field 354 includes data region identifiers associated with data regions that are available for retrieval. As another example, the region(s) in or awaiting write process and not available field 356 includes other data region identifiers associated with other data regions that are unavailable for retrieval when associated with an open write transaction. Such an open write transaction is associated with a multi-step writing process (e.g., issuing write slice requests, receiving write slice responses, issuing commit transaction requests) to store the other data regions. As yet another example, the region(s) in delete process and not available field 358 includes still other data region identifiers associated with still other data regions that are unavailable for retrieval when associated with an open delete transaction (e.g., issuing delete slice requests, receiving delete slice responses, issuing commit transaction requests).

A mapping of the data regions may be generated for the very large data object and the mapping may be stored in at least one of a local memory of an associated computing device and as a set of encoded mapping slices in storage units of the dispersed storage network. Subsequent to storage of the large data object in the dispersed storage network, the very large data object may be edited by one of revising one or more of the data regions and deleting one or more of the data regions. The data object storage tracking table 352 may be updated when the very large data object is edited.

Figure 10B:
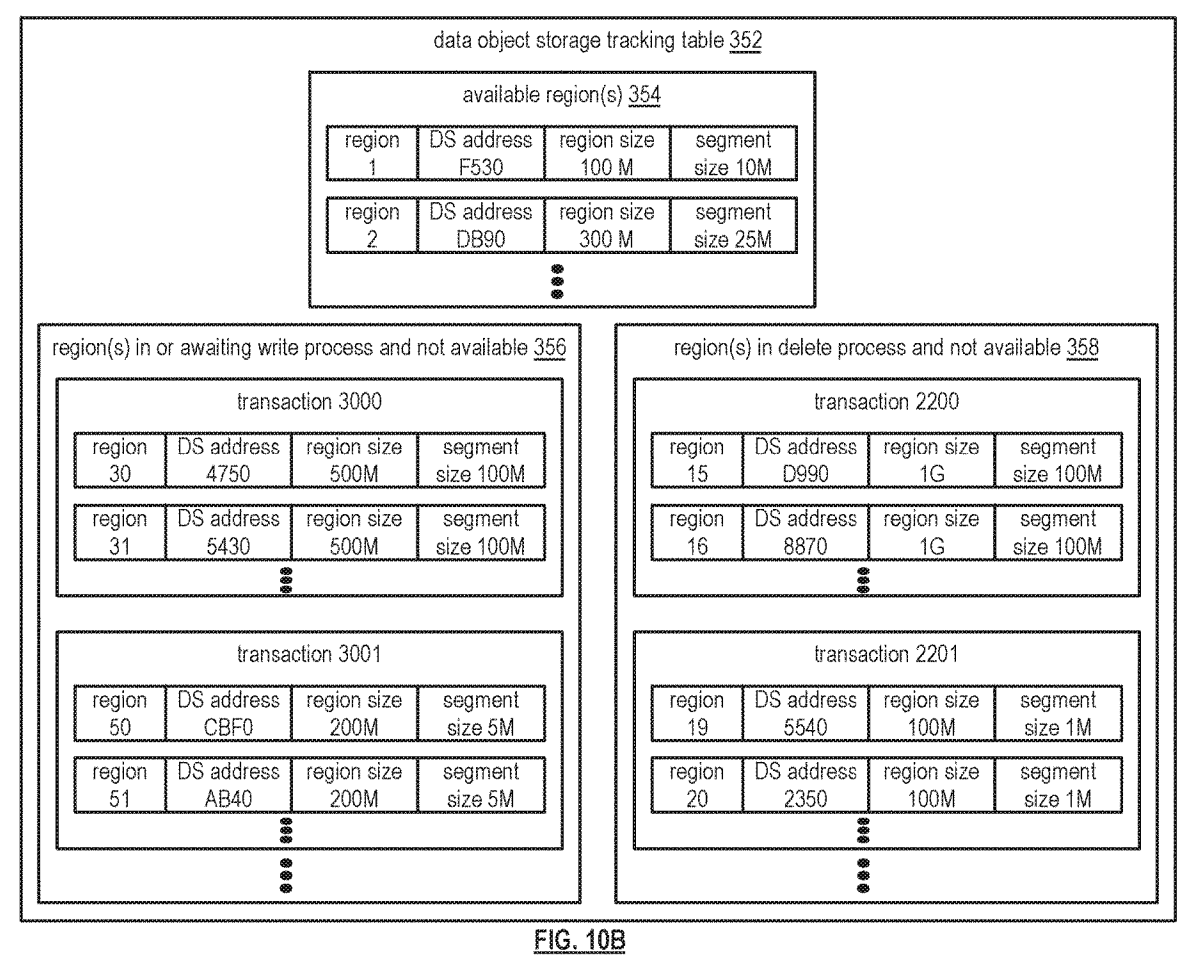

FIG. 10B is a diagram of an embodiment of a structure of a data object storage tracking table 352 that includes an available region(s) field 354, a region(s) in or awaiting write process and not available field 356, and a region(s) in delete process and not available field 358. The data object storage tracking table 352 is associated with a very large data object that is stored as a plurality of sets of encoded data slices in a dispersed storage network (DSN). The data object storage tracking table 352 may be utilized to identify storage locations of the very large data object within the DSN. The very large data object may be stored as a plurality of data regions within the DSN where each data region includes a plurality of data segments. Each data segment of the plurality of data segments is encoded using a dispersed storage error coding function to produce a set of encoded data slices of the plurality of sets of encoded data slices. For example, a first grouping of sets of encoded data slices is produced corresponding to a first data region and a second grouping of sets of encoded data slices is produced corresponding to a second data region. Each region of the one or more regions is stored in the DSN at a storage location corresponding to a dispersed storage (DS) address for the region. Each region may be uniquely identified by a region identifier (ID). The data object storage tracking table 352 may be stored in the DSN as a set of table slices at a storage location that includes a table DS address. At least one of a directory and an index may be utilized to identify the table DS address based on an object name (e.g., data ID) for the very large data object.

The available regions field 354 identifies visible regions, if any, by one or more region entries. A data region is visible when each data segment associated with the data region includes at least a write threshold number of favorably committed encoded data slices stored in the DSN. A favorably committed encoded data slice is visible for retrieving from a storage unit of the DSN when the encoded data slice has been written to the DSN and is associated with an executed commit transaction request.

Each region entry includes a region ID field (e.g., region 1), a DS address field (e.g., F530), a region size field (e.g., 100M), and a segment size field (e.g., 10M). A region ID entry is included in the region ID field to uniquely identify the region. A DS address entry is included in the DS address field to identify a storage location within the DSN of a first data segment of the plurality of data segments associated with the region. For example, the DS address entry identifies a source name (e.g., F530) for a first data segment. Source names corresponding to other data segments of the one or more data segments of the region may be generated based on the source name for the first data segment (e.g., incrementing a segment field entry by one for each sequential data segment of the plurality of data segments of the region). A region size entry of the region size field indicates a size of the region (e.g., 100M bytes). A segment size entry of the segment size field indicates a size (e.g., 10M bytes) of each data segment of the plurality of data segments of the region. A number of data segments may be determined by dividing the region size entry by the segment size entry.

The regions in or awaiting write process and not available field 356 identifies open write transactions with regards to the very large data object. An open write transaction includes a write transaction that is in progress for a data region but has not yet produced visibility of the data region. The regions in or awaiting write process and not available field 356 includes a subsection for each, if any, transaction that is associated with at least one data region of an open write transaction. Each subsection of the open write transaction section includes a transaction identifier (e.g., 3000) and a region entry for each data region associated with the open write transaction (e.g., region 30, DS address 4750, region size 500M, and segment size 100M).

The regions in delete process and not available field 358 identifies open delete transactions with regards to the very large data object. An open delete transaction includes a delete transaction that is in progress for a data region but has not yet produced full deletion of the data region. The regions in delete process and not available field 358 includes a subsection for each, if any, transaction that is associated with at least one data region of an open delete transaction. Each subsection includes a transaction identifier (ID) and a region entry for each data region associated with the open delete transaction (e.g., region 15, DS address D990, region size 1 G, and segment size 100M).

FIGS. 10C, and 10F-10J are schematic block diagrams of an embodiment of a dispersed storage network (DSN) that illustrate steps of an example of storing data in a dispersed storage network (DSN). The DSN includes distributed storage (DS) client modules 1 and 2 and the network 24 of FIG. 1, and a set of dispersed storage (DS) units 1-*n*. Each DS unit may be storage unit 36 of FIG. 1. Each DS client module includes the outbound DS processing 104 and the inbound DS processing 106 of FIG. 9. Each DS unit includes the processing module 108 and the memory 112 of FIG. 3.

Figure 10C:
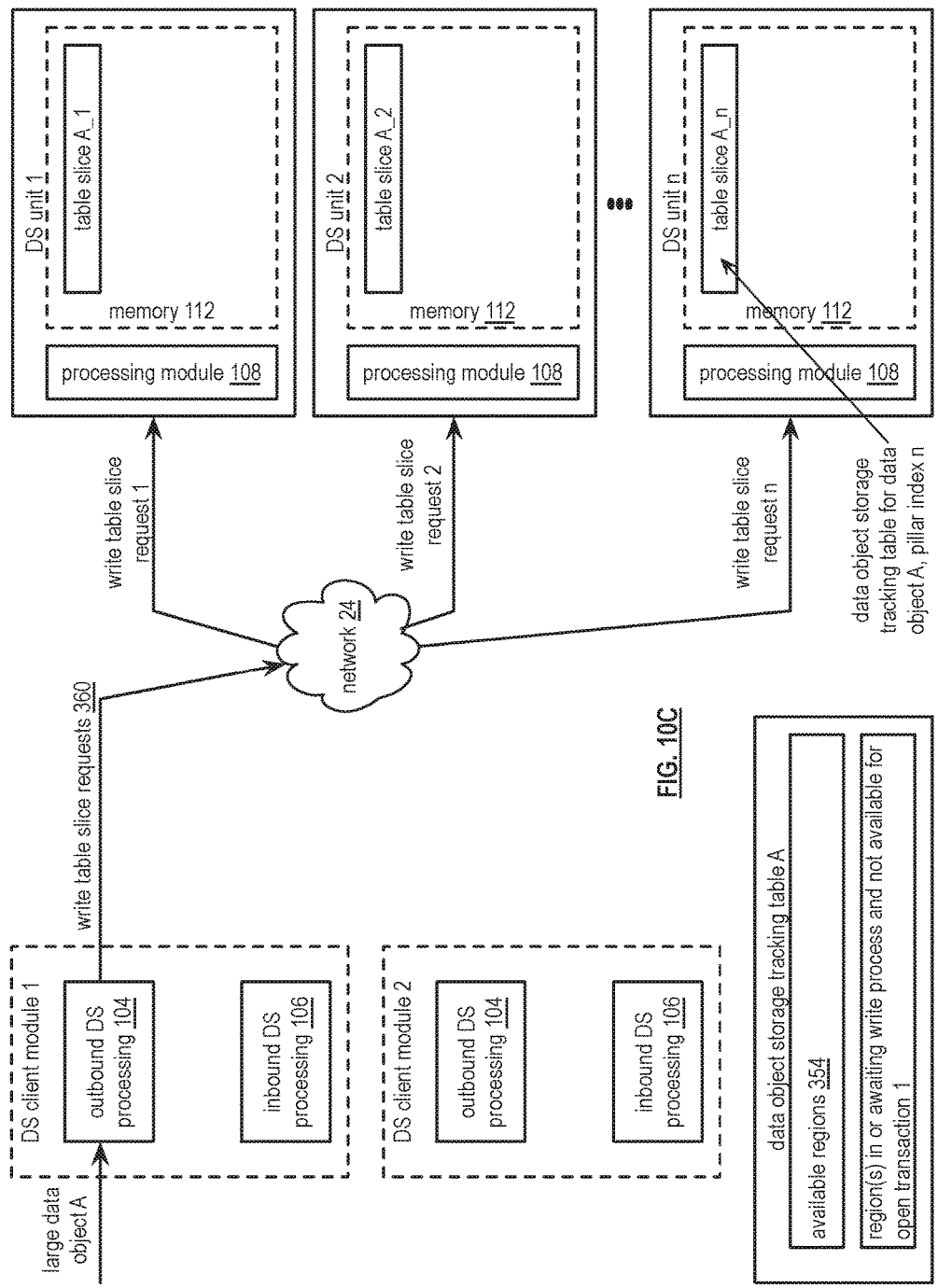
FIG. 10C is a schematic block diagram of an embodiment of a dispersed storage network (DSN) in accordance with the present invention.

In the example of storing data, as illustrated in FIG. 10C, the outbound DS processing 104 of a DS client module 1 receives a write request regarding a very large data object A. The outbound DS processing 104 determines whether the write request is an initial write request for the very large data object or a write request for editing the very large data object. As a specific example, the outbound DS processing 104 retrieves an indication from the write request. As another specific example, the outbound DS processing 104 searches for a data object storage tracking table A (e.g., associated with the very large data object A) and, when it is not found, indicates that the write request is the initial write request. The searching includes at least one of accessing a local memory of the DS client module 1 and accessing a directory using an identifier of the very large data object A to determine whether a DS address exists for the data object storage tracking table A.

When the write request is the initial write request, the outbound DS processing 104 divides the very large data object A into a plurality of data regions. The data regions may be of a common size or of different sizes. The outbound DS processing 104 generates the data object storage tracking table A to include an empty available regions field 354 and an empty regions in or awaiting write process and not available field for open transaction 1, where at least one data region is to be written utilizing transaction 1. Alternatively, or in addition to, the outbound DS processing 104 generates one or more other transactions for storing other data regions. For example, FIG. 10D illustrates an example of writing data regions where a first data region is written with a first transaction, second and third data regions are written with a second transaction, a first sub portion of a fourth data region is written with a third transaction, and a second sub portion of the fourth data region is written with a fourth transaction.

Returning to FIG. 10C, having generated the data object storage tracking table A, the outbound DS processing 104 dispersed storage error encodes the data object storage tracking table A to produce a set of encoded table slices A_1 through A_n. The outbound DS processing 104 issues, via the network 24, write table slice requests 360 to the set of DS units 1-*n* as write table slice requests 1-*n* to write the set of encoded table slices to the DS units 1-*n*. For example, the processing module 108 of DS unit 2 receives write table slice request 2 and stores the encoded table slice A_2 in the memory 112 of DS unit 2.

FIG. 10D is a diagram of an example of writing data regions. In an example of operation, transaction number 2 is generated for writing data regions 2 and 3 to dispersed storage (DS) storage units. Data region 2 is divided into data segments of data region 2 which are disperse storage error encoded to produce first sets of encoded data slices. Data region 3 is divided into data segments of data region 3 which are disperse storage error encoded to produce second sets of encoded data slices. DSN write requests are sent, which include the transaction number 2, regarding storing the first and second sets of encoded data slices to the DS units. When at least a write threshold number of write responses is received for each of the first and second sets of encoded data slices, a data object storage tracking table A is updated to indicate that the first and second data regions are available. For example, entries of data regions 1 and 2 are included in an available regions field of the data object storage tracking table A.

Figure 10E:
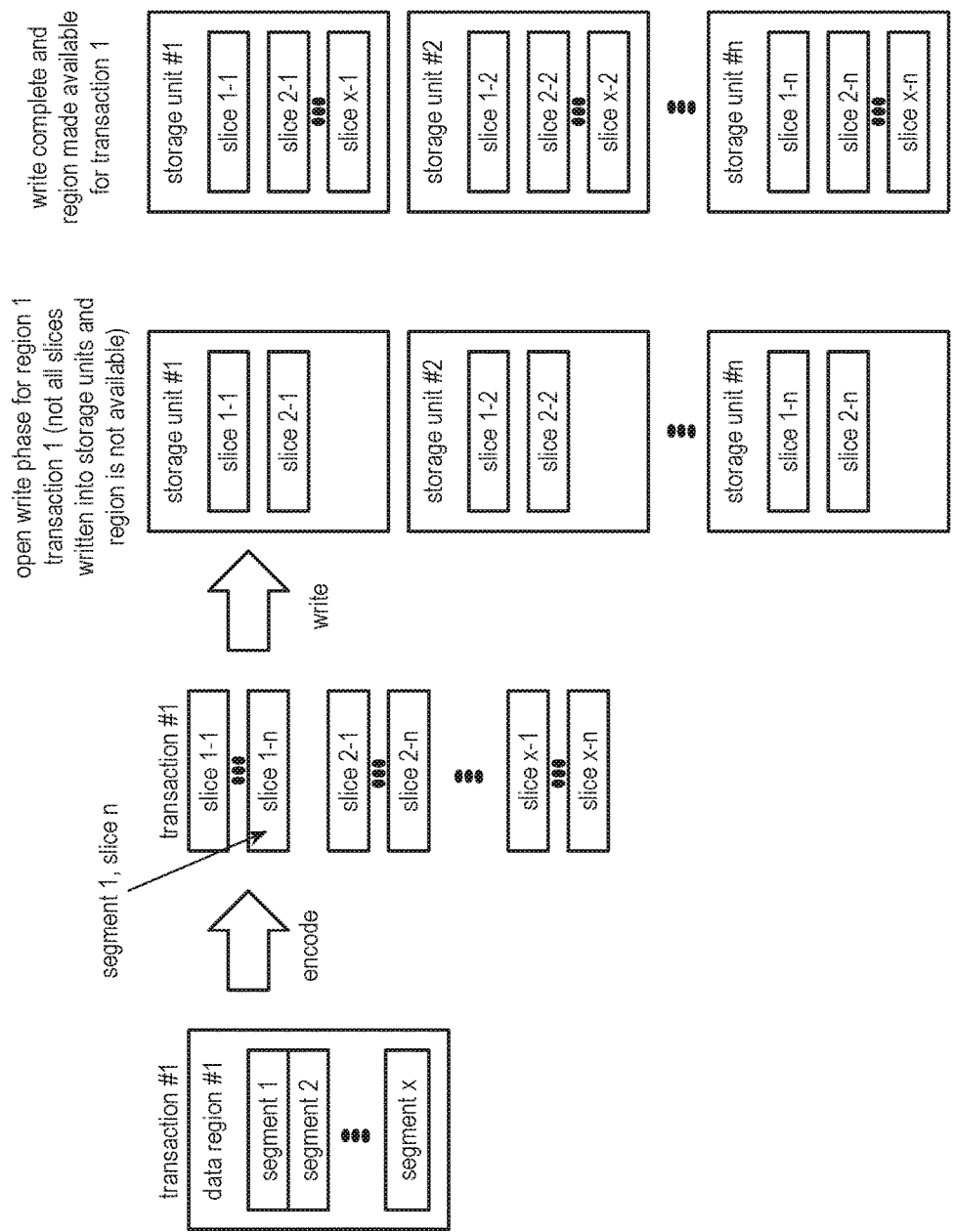
FIG. 10E is a diagram of an example of writing a data region in accordance with the present invention.

FIG. 10E is a diagram of an example of writing a data region 1 to a set of storage units 1-n of a dispersed storage network (DSN). The data region 1 is associated with a transaction 1 and is divided into a plurality of data segments 1-x. The plurality of data segments 1-x are each disperse storage error encoded to produce a plurality of sets of encoded data slices 1-1 through 1-n, 2-1 through 2-n, etc. through x-1 through x-n. Dispersed storage network (DSN) write requests regarding storing the plurality of sets of encoded data slices are sent to the storage units 1-n. Prior to storage of all of the encoded data slices, the data region 1 is associated with an open write phase for transaction 1 such that data region 1 is not available for retrieval. When at least a write threshold number of write responses is received from the set of storage units 1-n for each of the plurality of sets of encoded data slices, a data object storage tracking table A is updated to indicate that the first data region is available for retrieval.

Figure 10F:
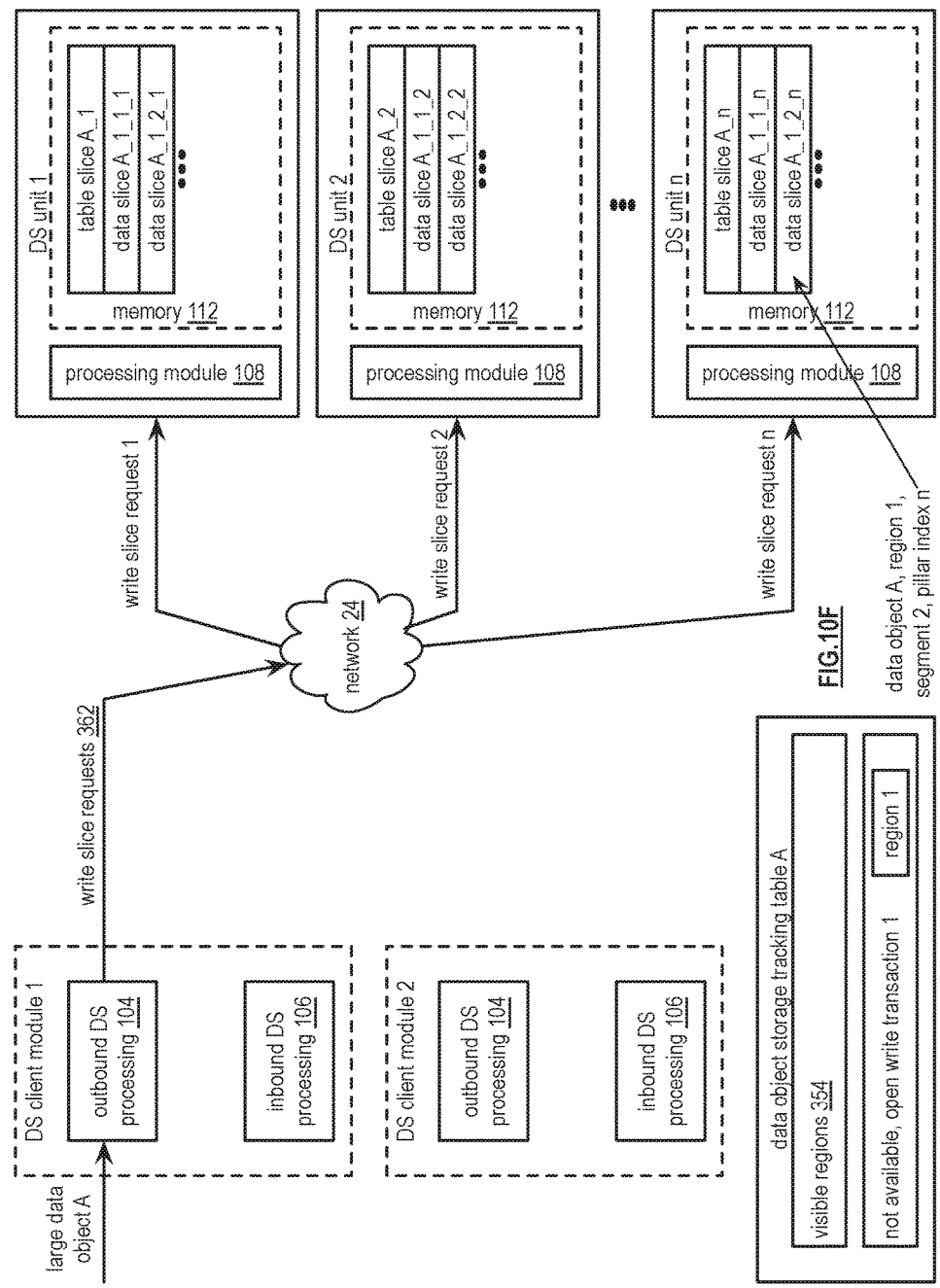
FIG. 10B is a diagram of an embodiment of a structure of a data object storage tracking table in accordance with the present invention.
FIG. 10D is a diagram of an example of writing data regions in accordance with the present invention.

FIG. 10F illustrates a continuation of the example of storing data. When the first and second data regions are to be associated with first and second transactions, for the first data region, the outbound DS processing 104 divides the first data region into data segments and disperse storage error encodes the data segments to produce sets of encoded data slices. The outbound DS processing 104 sends write slice requests 362 that includes write slice requests 1-n as DSN write requests regarding storing the sets of encoded data slices to the set of DS units 1-n. For example, DS unit 1 stores data slice A_1_1_1 for data object A, region 1, segment 1, and slice pillar index 1 and stores data slice A_1_2_1 for segment 2 etc.

The outbound DS processing 104 updates the data object storage tracking table A to indicate that data region 1 is not available and that data region 1 is associated with open write transaction 1. As a specific example, the inbound DS processing 106 of DS client module 1 retrieves at least a decode threshold number of encoded table slices of the set of encoded table slices A_1 through A_n and decodes the at least a decode threshold number of encoded table slices to recapture the data object storage tracking table A. The outbound DS processing 104 updates the data object storage tracking table A to produce an updated data object storage tracking table A (e.g., associating data region 1 with open write transaction 1). Having produced the updated data object storage tracking table A, the outbound DS processing 104 disperse storage error encodes the updated data object storage tracking table to produce a set of updated encoded table slices A_1 through A_n and writes the set of updated encoded table slices to the set of DS units 1-n.

Figure 10G:
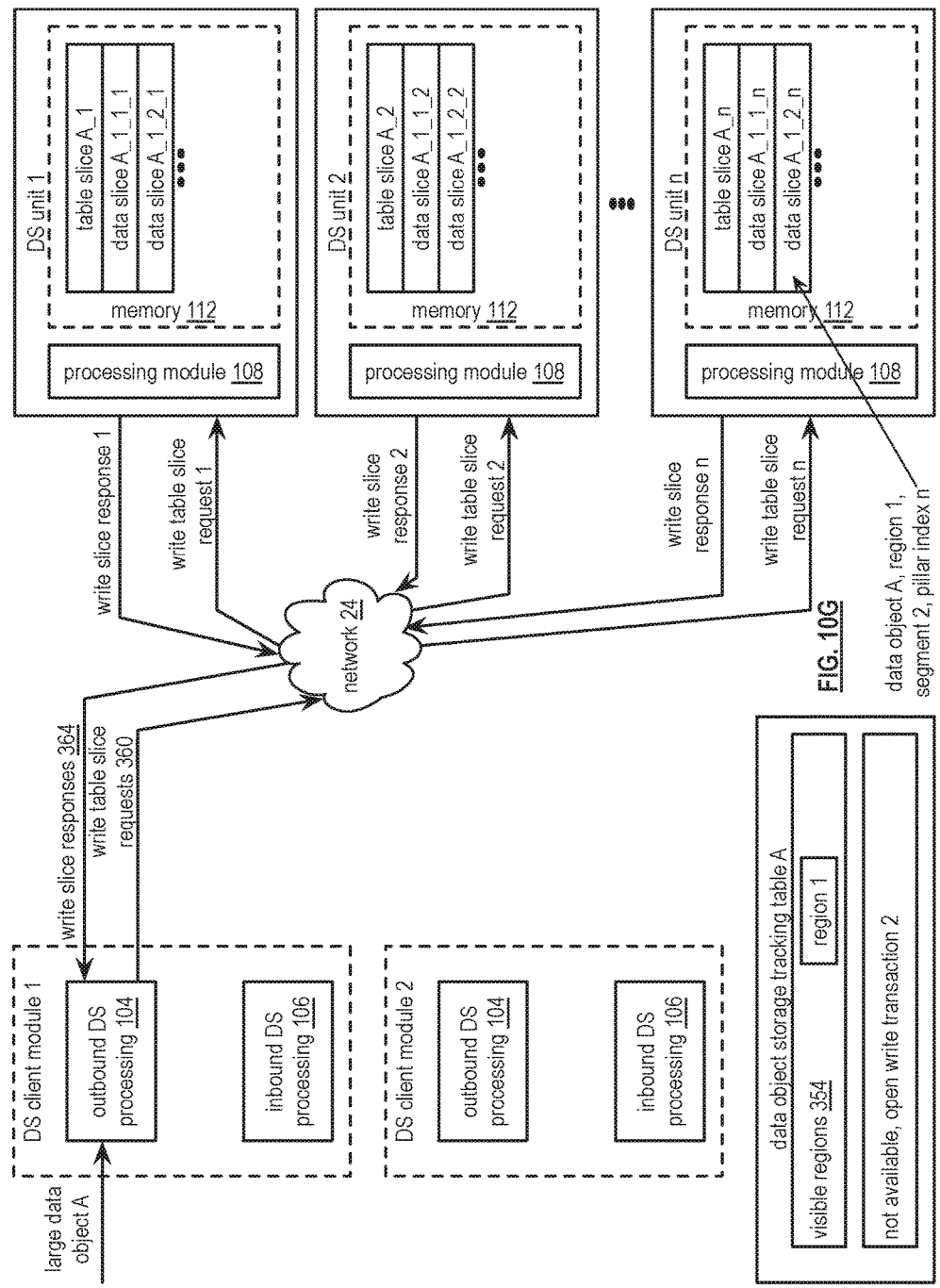

FIG. 10G illustrates a continuation of the example of storing data. When at least a write threshold number of write slice responses 364 (e.g., write slice responses 1-n) is received for each of the sets of encoded data slices, the outbound DS processing 104 updates the data object storage tracking table A to indicate that the first data region is available for retrieval (e.g., associating data region 1 with the visible regions 354. The outbound DS processing 104 further updates the data object storing tracking table A to indicate that transaction 2 is an open write transaction, where transaction 2 is associated with data region 2. The outbound DS processing 104 encodes the updated data object storing tracking table A to produce updated encoded table slices A_1 through A_n. The outbound DS processing 104 issues write table slice requests 360 which includes write table slice requests 1-n to the set of DS units 1-n. Each DS unit stores a corresponding encoded table slice in a corresponding memory 112.

Figure 10H:
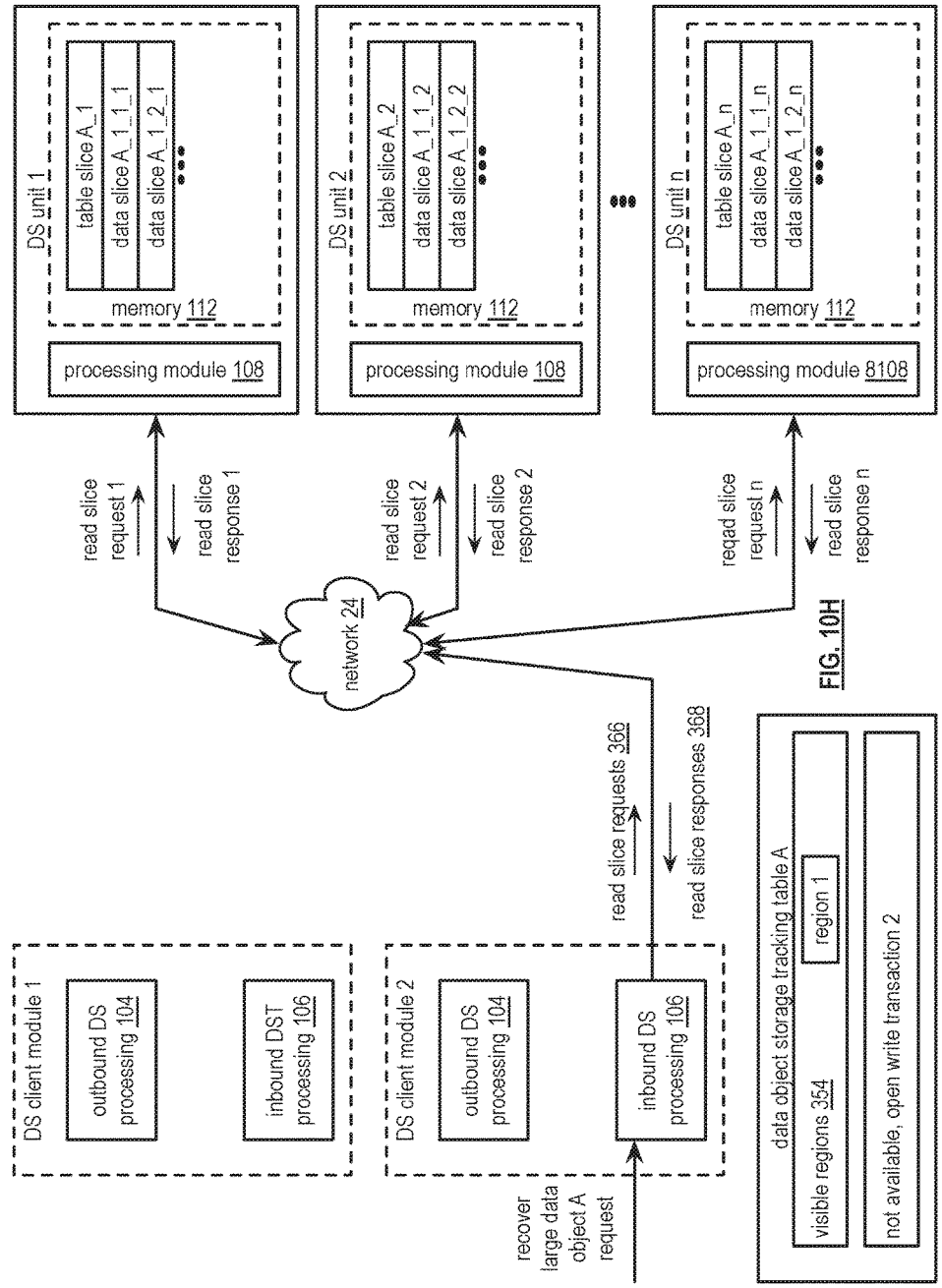

FIG. 10H illustrates a continuation of the example of storing data where a very large data object A request is received by the DS client module 2 when storing all of the data regions of the very large data object A has not been completed (e.g., only data region 1 is visible). The inbound DS processing 106 of DS client module 2 performs at least one of a directory lookup and an index lookup to identify the DS address of the data object storage tracking table A based on the identifier of the very large data object A. The inbound DS processing 106 issues read slice requests 366 to the set of DS units 1-n, where the read slice requests 366 includes read slice requests 1-n based on the DS address of the data object storage tracking table A. The inbound DS processing 106 receives read slice responses 368 (e.g., read slice responses 1-n) from the set of DS units 1-n. The inbound DS processing 106 disperse storage error decodes at least a decode threshold number of encoded table slices from the read slice responses 368 to reproduce the data object storage tracking table A.

Having recovered the data object storage tracking table A, the inbound DS processing 106 identifies one or more visible regions (e.g., data region 1) from the data object storage tracking table A. The inbound DS processing 106 identifies DS addresses associated with one or more data segments of data region 1 and issues further read slice requests 366 based on the DS addresses. The inbound DS processing 106 receives read slice responses 368 that includes one or more sets of encoded data slices (e.g., data slice A_1_1_1 through A_1_1_n for data segment 1, etc.). The inbound DS processing 106 disperse storage error decodes the one or more sets of encoded data slices to reproduce data region 1. Alternatively, or in addition to, the inbound DS processing 106 identifies the open write transaction 2 from the data object storage tracking table A and determines to subsequently recover another data region (e.g., data region 2) when the open write transaction 2 has completed.

Figure 10I:
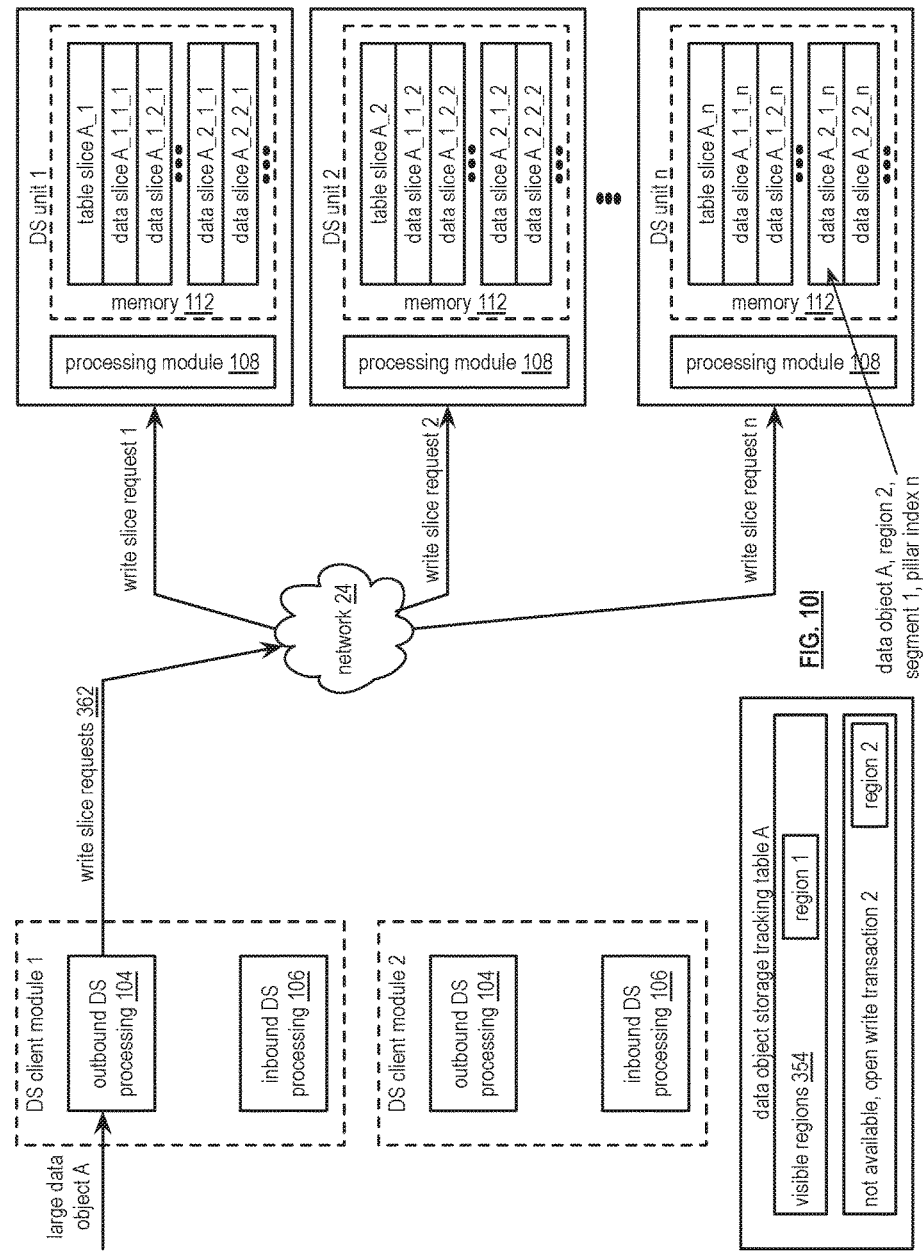

FIG. 10I illustrates a continuation of the example of storing data. The outbound DS processing 104 of a DS client module 1 divides data region 2 into data segments of the second data region. The outbound DS processing 104 disperse storage error encodes the data segments of the second data region to produce second sets of encoded data slices (e.g., data slices A_2_1_1 through A_2_1_n for a first data segment of the second data region). The outbound DS processing 104 sends write slice requests 362 (e.g., DSN write requests) regarding storing the second sets of encoded data slices to the set of DS units 1-n. The outbound DS processing 104 updates the data object storage tracking table A to associate data region 2 with the open write transaction 2. The outbound DS processing 104 may store the updated data object storage tracking table A in the set of DS units 1-n (e.g., as an updated set of encoded table slices).

Figure 10J:
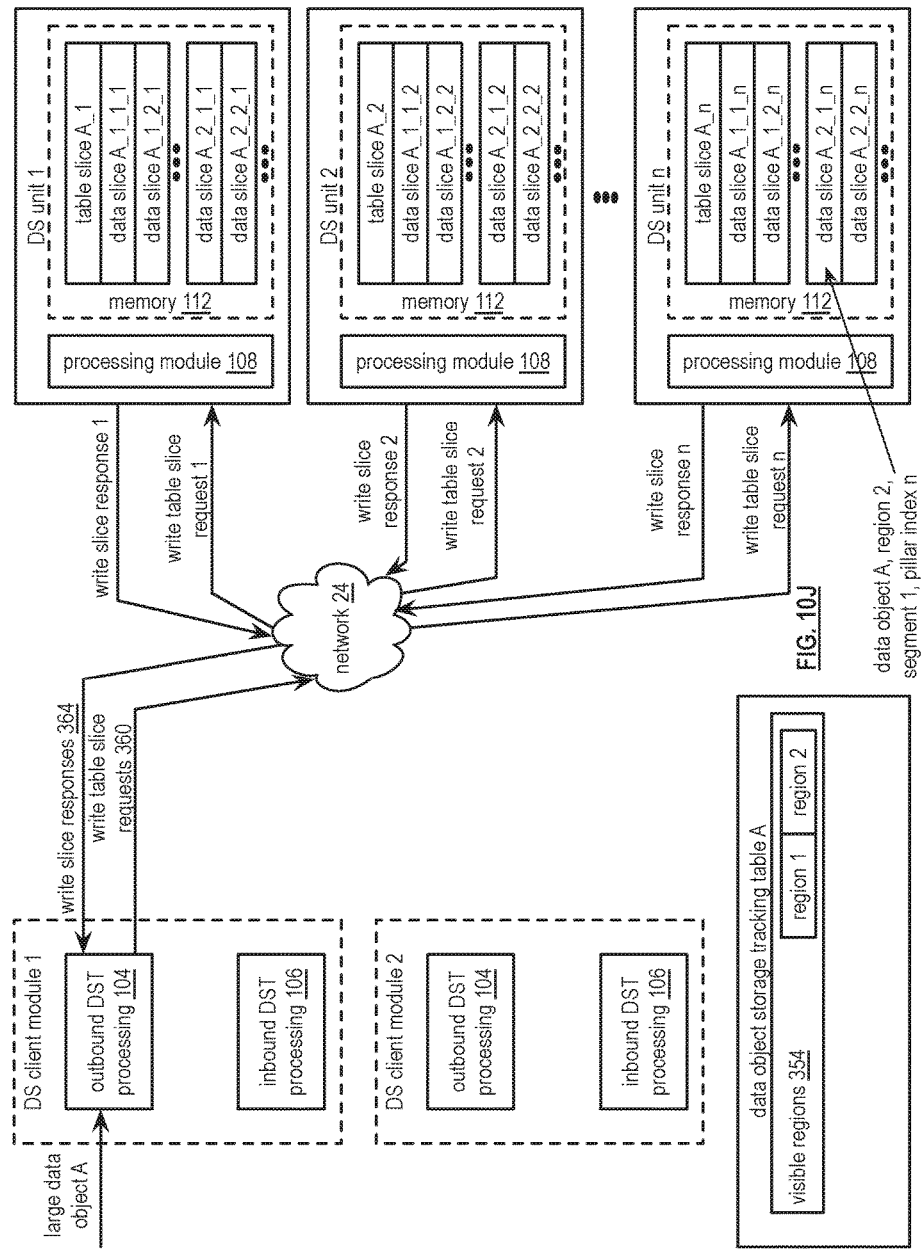

FIG. 10J illustrates a continuation of the example of storing data. When the outbound DS processing 104 of a DS client module 1 receives at least a write threshold number of write slice responses 364 (e.g., second write responses) for each of the second sets of encoded data slices, the outbound DS processing module 104 updates the data object storage tracking table A to indicate that the second data region is available by associating the identifier for data region 2 with the visible regions field 354 such that both data regions 1 and 2 are indicated as visible regions. The outbound DS processing 104 further updates the data object storing tracking table A to exclude open write transactions when the storing of the very large data object A has been completed. The outbound DS processing 104 dispersed storage error encodes the updated data object storage tracking table A to produce an updated set of encoded table slices A_1 through A_n and issues write table slice requests 360 to the set of DS units 1-n, where the write table slice requests 360 includes the updated set of encoded data slices.

When the write request is for editing the very large data object A, the outbound DS processing 104 identifies one data region as being edited based on the write request. The outbound DS processing 104 updates the data object storage tracking table A to indicate that the one data region is unavailable (e.g., an open write transaction, an open delete transaction). The outbound DS processing 104 disperse storage error encodes one or more edited data segments of a plurality of data segments of the one data region to produce one or more sets of edited encoded data slices. The outbound DS processing 104 sends updated DSN write requests 362 regarding storing the one or more sets of edited encoded data slices to the set of DS units 1-n. When at least a write threshold number of write responses 364 is received for each of the one or more sets of edited encoded data slices, the outbound DS processing 104 updates the data object storage tracking table A to indicate that the one data region is available.

FIG. 11 is a flowchart illustrating an example of writing a data object. The method begins at step 390 where a processing module (e.g., of a dispersed storage processing module of a computing device of a dispersed storage network (DSN)) receives a write request regarding a very large data object. The method continues at step 392 where the processing module determines whether the write request is an initial write request for the very large data object or a write request for editing the very large data object. As examples of editing the very large data object, the editing may include revising one or more data regions of the very large data object or deleting the one or more of the data regions. As a specific example, the processing module retrieves an indication from the write request (e.g., a flag denoting a new write request). As another specific example, the processing module searches for a data object storage tracking table associated with the very large data object and, when it is not found, indicates that the write request is the initial write request. The method branches to step 404 when the write request is the initial write request. The method continues to step 394 when the write request is the write request for editing.

When the write request is for editing the very large data object, the method continues at step 394 where the processing module identifies one of the data regions being edited based on the write request (e.g., an offset identifier, a region identifier). The method continues at step 396 where the processing module updates the data object storage tracking table to indicate that the one data region is unavailable. As a specific example, the processing module retrieves at least a decode threshold number of encoded table slices of a set of encoded table slices from storage units of the DSN. Having retrieved the slices, the processing module decodes the at least a decode threshold number of encoded table slices to recapture the data object storage tracking table. Next, the processing module updates the data object storage tracking table to produce an updated data object storage tracking table (e.g., indicating that the one data region is unavailable). Having updated the data object storage tracking table, the processing module dispersed storage error encodes the updated data object storage tracking table to produce a set of updated encoded table slices. Next, the processing module writes the set of updated encoded table slices to the at least some of the storage units for storage therein.

The method continues at step 398 where the processing module disperse storage error encodes one or more edited data segments of data segments of the one data region to produce one or more sets of edited encoded data slices. The method continues at step 400 where the processing module sends updated DSN write requests regarding storing the one or more sets of edited encoded data slices to the storage units. When at least a write threshold number of write responses is received for each of the one or more sets of edited encoded data slices, the method continues at step 402 where the processing module updates the data object storage tracking table to indicate that the one data region is available.

When the write request is the initial write request, the method continues at step 404 where the processing module divides the very large data object into data regions. The method continues at step 406 where the processing module generates the data object storage tracking table that includes a section for identifying, if any, one or more data regions of the data regions that are available for retrieval and a section for identifying, if any, one or more other data regions that are unavailable for retrieval. The processing module disperse storage error encodes the data object storage tracking table to produce the set of encoded table slices and writes the set of encoded table slices to at least some of the storage units.

For a first data region, the method continues at step 408 where the processing module divides the first data region into data segments. The method continues at step 410 where the processing module generates a mapping of the data regions for the very large data object and stores the mapping in at least one of a local memory of the computing device and as a set of encoded mapping slices in at least some of the storage units. The method continues at step 412 where the processing module dispersed storage error encodes the data segments to produce sets of encoded data slices. The method continues at step 414 where the processing module sends DSN write requests regarding storing the sets of encoded data slices to the storage units of the DSN. When at least a write threshold number of write responses is received for each of the sets of encoded data slices, the method continues at step 416 where the processing module updates updating the data object storage tracking table to indicate that the first data region is available for retrieval.

Alternatively, or in addition to, the method continues at step 418 where the processing module stores a second data region. As a specific example, the processing module divides the second data region into data segments of the second data region and disperse storage error encodes the data segments of the second data region to produce second sets of encoded data slices. Next, the processing module sends second DSN write requests regarding storing the second sets of encoded data slices to the storage units. When at least a write threshold number of second write responses are received for each of the second sets of encoded data slices, the processing module updates the data object storage tracking table to indicate that the second data region is available.

Alternatively, the processing module writes one or more data regions as part of a common transaction. As a specific example, the processing module generates a transaction number for writing the one or more data regions to the storage units. When the transaction number includes at least two data regions, for a first one of the at least two data regions, the processing module divides the first one of the at least two data regions into data segments of the first one of the at least two data regions and disperse storage error encodes the data segments of the first one of the at least two data regions to produce first sets of encoded data slices. For a second one of the at least two data regions, the processing module divides the second one of the at least two data regions into data segments of the second one of the at least two data regions and disperse storage error encodes the data segments of the second one of the at least two data regions to produce second sets of encoded data slices. Next, the processing module sends DSN write requests, which include the transaction number, regarding storing the first and second sets of encoded data slices to the storage units. When at least a write threshold number of write responses is received for each of the first and second sets of encoded data slices, the processing module updates the data object storage tracking table to indicate that the first one and the second one of the at least two data regions are available.

FIG. 12 is a flowchart illustrating an example of overwriting a data object. The method begins at step 436 where a processing module (e.g., of a dispersed storage (DS) processing module of a computing device of a dispersed storage network (DSN)) receives a write data object request (e.g., an overwrite operation request) that includes at least a portion of a very large data object for storage and an object identifier associated with a stored very large data object stored in a dispersed storage network (DSN) memory. The method continues with steps 372 and 376 where the processing module identifies a DS address associated with the object identifier and retrieves a region header object from the DSN memory using the DS address.

The method continues at step 438 where the processing module updates the region header object to include a new open write transaction with no regions entries. For example, the processing module generates a transaction ID associated with the write request and generates an open write transaction section to include the transaction ID. The method continues at step 440 where the processing module stores the updated region header object in the DSN memory. For example, the processing module encodes the updated region header object using a dispersed storage error coding function to produce a set of header slices, generates and outputs a set of write slice requests that includes the transaction ID, the set of header slices, and a set of header slice names based on the DS address of the region header object, and generates and outputs a set of commit write requests that includes the transaction ID when a write threshold number of favorable write slice responses has been received from the DSN memory.

The method continues at step 442 where the processing module stores a first region of the data object in the DSN memory. The method continues at step 444 where the processing module updates the region header object in the DSN memory. The method continues at step 446 where the processing module stores any subsequent regions of the data object in the DSN memory. The method continues at step 448 where the processing module updates the region header object in the DSN memory for subsequent regions.

When each segment of each region has been committed, the method continues at step 450 where the processing module updates the region header object to include an open delete transaction. The updating includes generating a second transaction ID to be associated with a delete operation of the previously stored data. The method continues with step 424 of FIG. 12 where the processing module updates the region header object by transferring region entries of visible regions to the open delete transaction section.

The method continues at step 452 where the processing module updates the region header object by transferring region entries of the new open write transaction section to the visible regions section. Such transferring establishes the received data object as the current revision of the data object. The method continues at step 454 where the processing module stores the updated region header object in the DSN memory such that subsequent read operations access the received data object. The method continues with steps 428 and 430 of FIG. 12 where, for each region associated with the open delete transaction, the processing module facilitates deleting the region from the DSN memory and for each deleted region, the processing module updates the region header object in the DSN memory to disassociate the region with the open delete transaction.

FIG. 13 is a flowchart illustrating an example of updating a data object when competing devices are attempting to write to the same DS units. In this instance the write data request is broken into two or more phases. As shown in step 504, instead of initiating write requests, one or more DS processing modules transmit lock requests to the DS units holding encoded data slices for the data object. Lock requests can include slice names and a transaction identifier associated with the data object being updated. Alternatively, DS processing units can send multiple lock messages for a single transaction identifier, followed by a single persist message being transmitted for all of the affected DS units. Lock requests can include additional information to assist in the updating process, including information that can be used by a DS units to identify every DS unit involved in the update. The information could include a list of names, naming schemes and other information that will be known by one skilled in the relevant art.

Based on whether the particular encoded data slices are already being overwritten by another DS processing unit the DS units either grant the lock request, ignore the lock requests or actively reject the lock requests. The decision to grant a lock request can depend on whether another processing unit has already been granted a lock request for encoded data slices with the same slice name. The DS units may also respond to the one or more processing units indicating that another lock request has already been granted.

The method continues at step 506, where the one or more DS processing modules receive responses from the DS units and the one or more DS processing modules determine (at step 510) whether a write threshold number of distributed storage units have granted the requested lock requests. When a write threshold number of DS units have granted lock requests, the one or more DS processing modules transmit a persist message to each of the write threshold number of distributed storage units, as shown in step 512. A persist message can include the encoded data slices that the one or more processing units intend to update, along with other information to assist the DS units. On receipt of the persist message the DS units unlock the slice names associated with the transaction identifier and the DS units deny subsequent lock requests from other DS processing units until the encoded data slices have been successfully overwritten.

When a write threshold number of distributed storage units fail to grant lock requests the method continues at step 522, and the one or more DS processing units can transmit a rollback message to any of the DS units from which the lock request has been granted. Upon receipt of the rollback message the DS units may unlock the slice names associated with the transaction identifier. Once the slice names have been unlocked, the DS units can then grant lock requests from other processing units for the subject encoded data slices. The transaction identifier may alternatively be replaced with a DS processing unit identifier if a single DS processing unit does not make conflicting updates to a name. The transaction identifier would then not be provided in the persistence and/or lock request messages, instead the distributed storage units could unlock based on names provided in the commit/rollback messages for locks associated with a particular DS processing unit.

Advantages of the multi-phase lock request followed by the persist message include, but are not limited to, reduction of network traffic based on encoded data slices not being sent when a lock is not achieved and a reduction of memory being used to hold encoded data slices until a write commit can be granted.

Once persist messages have been received by a write threshold of DS units one or more of the affected distributed storage units may fail to overwrite the affected encoded data slices, in this case the one or more DS processing units may abandon the update and an asynchronous agent can be used to delete each of the involved updated encoded data slices, after which the asynchronous agent may delete the lock request. This will ensure that partially written data objects are removed from the DSN memory.

FIG. 14 is schematic block diagram of an embodiment of a dispersed storage network (DSN) that illustrate steps of an example of updating a data object when competing devices are attempting to write to the same distributed storage units of a dispersed storage network (DSN). The DSN includes distributed storage (DS) client modules 1 and 2 and the network 24 of FIG. 1, and a set of dispersed storage (DS) units 1-n. Each DS unit may be the DS execution unit 36 of FIG. 1. Each DS client module includes the outbound DS processing 104 and the inbound DS processing 106 of FIG. 3. Each DS unit includes the processing module 108 and the memory 112 of FIG. 3.

In the example of updating data, as illustrated in FIG. 14, the outbound DS processing 104 of a DS client module 1 receives an update request regarding a data object A. The DS client module 1 sends a plurality of lock requests (660) to DS units 1-n. DS units 1-n grant the lock requests depending on whether another processing unit has already been granted a lock request for encoded data slices with the same slice name. DS units 1-n can then lock the indicated encoded data slices and send a lock grant to DS client module 1. The DS client module 1, depending on whether a write threshold of lock grants have been received from DS units 1-n, can then transmit a persist message (680) to the DS units from which lock grants have been received.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:
    determining that dispersed error encoded data slices stored in a plurality of distributed storage units of the DSN are to be updated;
    sending a plurality of lock requests to the plurality of distributed storage units containing dispersed encoded data slices determined to require updating;
    receiving a response from a write threshold number of distributed storage units of the plurality of distributed storage units; and
    when the response from a write threshold number of distributed storage units of the plurality of distributed storage units indicates that a lock request has been granted by a first write threshold number of distributed storage units, sending a persist message to a second write threshold number of distributed storage units.

2. The method of claim 1, wherein each of the lock requests of the plurality of lock requests includes a slice name for a dispersed error encoded data slice.

3. The method of claim 1, wherein each of the lock requests of the plurality of lock requests includes a transaction identifier associated with the determining that a plurality of distributed storage units of the DSN is to be updated.

4. The method of claim 1 further comprises;
when the response from the write threshold number of distributed storage units of the plurality of distributed storage units indicates that a lock request has not been granted by each of the write threshold number of distributed storage units, sending a message to any of the write threshold number of distributed storage units from which the lock request was granted that the lock grant should be released.

5. The method of claim 1, wherein the persist message includes dispersed error encoded data slices intended to be updated by the one or more processing modules of the one or more computing devices of the DSN.

6. The method of claim 1 further comprises:
receiving a write threshold number of persist responses from the plurality of distributed storage units, wherein a persist response indicates that a distributed storage unit has been updated.

7. The method of claim 4 further comprises:
receiving a message from a first distributed storage unit indicating that a second distributed storage unit has been granted a lock request for a same slice name.

8. A computer readable memory comprises:
a first memory element that stores operational instructions that, when executed by a computing device of a dispersed storage network (DSN), causes the computing device to:
determine that a plurality of distributed storage units of the DSN is to be updated;
send a plurality of lock requests to the plurality of distributed storage units containing dispersed encoded data slices determined to require updating;
receive a response from a write threshold number of distributed storage units of the plurality of distributed storage units; and
when the response from a write threshold number of distributed storage units of the plurality of distributed storage units indicates that a lock request has been granted by a first write threshold number of distributed storage units, send a persist message to a second write threshold number of distributed storage units.

9. The computer readable memory of claim 8, wherein each of the lock requests of the plurality of lock requests includes a slice name for a first distributed storage unit of the plurality of distributed storage units.

10. The computer readable memory of claim 8, wherein each of the lock requests of the plurality of lock requests includes a transaction identifier associated with the determining that a plurality of distributed storage units of the DSN is to be updated.

11. The computer readable memory of claim 8 further comprises;
when the response from the write threshold number of distributed storage units of the plurality of distributed storage units indicates that a lock request has not been granted by each of the write threshold number of distributed storage units, sending a message to any of the write threshold number of distributed storage units from which the lock request was granted that the lock grant should be released.

12. The computer readable memory of claim 8, wherein the persist message includes data intended to be updated by the write threshold number of distributed storage units.

13. The computer readable memory of claim 8 further comprises:
receiving a write threshold number of persist responses from the plurality of distributed storage units, wherein a persist response indicates that a distributed storage unit has been updated.

14. The computer readable memory of claim 8 further comprises:
receiving a message from a first distributed storage unit indicating that a second distributed storage unit has been granted a lock request for a same slice name.

15. A method for execution by a distributed storage unit of a dispersed storage network (DSN), the method comprises:
receiving a lock request from a distributed processing unit of a dispersed storage network (DSN), wherein the lock request is associated with a determination that a dispersed error encoded data slice in the distributed storage unit is to be updated;
determining whether another distributed processing unit has already been granted a lock request for the dispersed error encoded data slice; and
when another distributed processing unit has not already been granted a lock request for the dispersed error encoded data slice, sending a message to the distributed processing unit that the lock request has been granted for the dispersed error encoded data slice.

16. The method of claim 15, wherein the lock request includes a slice name for the dispersed error encoded data slice.

17. The method of claim 15 further comprises:
when another distributed processing unit has already been granted a lock request for the dispersed error encoded data slice, sending a message to the distributed processing unit that the lock request will not be granted for the dispersed error encoded data slice.

18. The method of claim 15 further comprises:
receiving a persist message from the distributed processing unit, wherein the persist message includes one or more dispersed error encoded data slices to be updated and a transaction identifier; and
unlocking a slice name for each of the dispersed error encoded data slices associated with the transaction identifier.

19. The method of claim 15 further comprises:
receiving a message from the distributed processing unit that the lock request that has been granted should be released, wherein the message that the distributed processing unit that the lock request that has been granted should be released is based on the distributed processing unit not being granted a lock request by each of a write threshold number of distributed storage units.

* * * * *